US 9,602,061 B2

(12) United States Patent
Niida (10) Patent No.: US 9,602,061 B2
(45) Date of Patent: Mar. 21, 2017

(54) DISTRIBUTED AMPLIFIER

(71) Applicant: FUJITSU LIMITED, Kawasaki-shi, Kanagawa (JP)

(72) Inventor: Yoshitaka Niida, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/610,283

(22) Filed: Jan. 30, 2015

(65) Prior Publication Data

US 2015/0256132 A1 Sep. 10, 2015

(30) Foreign Application Priority Data

Mar. 10, 2014 (JP) ................................. 2014-046935

(51) Int. Cl.
*H03F 1/18* (2006.01)
*H03F 3/21* (2006.01)
*H03F 3/193* (2006.01)
*H03F 3/60* (2006.01)

(52) U.S. Cl.
CPC .............. *H03F 1/18* (2013.01); *H03F 3/193* (2013.01); *H03F 3/21* (2013.01); *H03F 3/607* (2013.01); *H03F 2200/108* (2013.01); *H03F 2200/451* (2013.01)

(58) Field of Classification Search
USPC ................. 330/295, 124 R, 84, 53, 286, 302
See application file for complete search history.

(56) References Cited

U.S. PATENT DOCUMENTS

| 4,788,511 | A | 11/1988 | Schindler |
| 6,313,699 | B1 | 11/2001 | Nishijima et al. |
| 6,313,700 | B1 | 11/2001 | Nishijima et al. |
| 6,489,843 | B1 | 12/2002 | Nishijima et al. |
| 7,091,791 | B1 | 8/2006 | Terrovitis |
| 7,397,308 | B2 * | 7/2008 | Mordarski ............ H03F 3/605 330/112 |
| 7,482,874 | B2 * | 1/2009 | Heydari ................ H03F 3/604 330/286 |
| 2008/0074191 | A1 | 3/2008 | Mordarski |

FOREIGN PATENT DOCUMENTS

| EP | 1039574 A2 | 9/2000 |
| EP | 2498399 A2 | 9/2012 |
| JP | 11-177356 | 7/1999 |
| WO | 97/13320 | 4/1997 |

OTHER PUBLICATIONS

EESR—Extended European Search Report dated Aug. 13, 2015 issued with respect to the corresponding European Patent Application No. 15152148.1.
EPOA—Office Action mailed on Sep. 6, 2016 issued with respect to the corresponding European Patent Application No. 15152148.1.

* cited by examiner

*Primary Examiner* — Hieu Nguyen
(74) *Attorney, Agent, or Firm* — Fujitsu Patent Center (57) ABSTRACT

A distributed amplifier includes a plurality of transistors, a first line connecting gate electrodes of the transistors to each other, and a second line connecting drain electrodes of the transistors to each other, wherein the first line and the second line are electromagnetically coupled to each other at a position situated between immediately adjacent transistors among the plurality of transistors.

4 Claims, 13 Drawing Sheets

DISTRIBUTED AMPLIFIER

CROSS-REFERENCE TO RELATED APPLICATIONS

The present application is based upon and claims the benefit of priority from the prior Japanese Patent Application No. 2014-046935 filed on Mar. 10, 2014, with the Japanese Patent Office, the entire contents of which are incorporated herein by reference.

FIELD

The disclosures herein relate to a distributed amplifier.

BACKGROUND

There is a high expectation that devices using semiconductors such as GaN or InP are operable with high voltage at high speed. Utilizing the characteristics of these materials, an effort has been made to develop high-power amplifiers operating at high frequency, giving rise to expectations for highly efficient, high-power, broad-range amplifiers.

Circuit types of broad bandwidth amplifiers include distributed amplifiers. A distributed amplifier has a plurality of transistors arranged in a line, with the gate electrodes thereof being connected to each other through a wire, and the drain electrodes thereof being also connected to each other through a wire. The wire connecting the gate electrodes together serves as an input line, and the wire connecting the drain electrodes together serves as an output line. The wires are designed to have proper lengths determined based on the parasitic capacitances and the like of the transistors as well as to have proper impedances responsive to the wire widths and a substrate thickness, thereby providing an amplifier having a desired bandwidth. However, a distributed amplifier inevitably has the bandwidth thereof limited on higher frequencies due to the parasitic capacitances of the transistors and the shapes of wires between the transistors.

SUMMARY

According to an aspect of the embodiment, a distributed amplifier includes a plurality of transistors, a first line connecting gate electrodes of the transistors to each other, and a second line connecting drain electrodes of the transistors to each other, wherein the first line and the second line are electromagnetically coupled to each other at a position situated between immediately adjacent transistors among the plurality of transistors.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the present invention will be described with reference to the accompanying drawings.

In the following, embodiments of the invention will be described with reference to the accompanying drawings. In these drawings, the same or corresponding elements are referred to by the same or corresponding numerals, and a description thereof will be omitted as appropriate.

Figure 1:
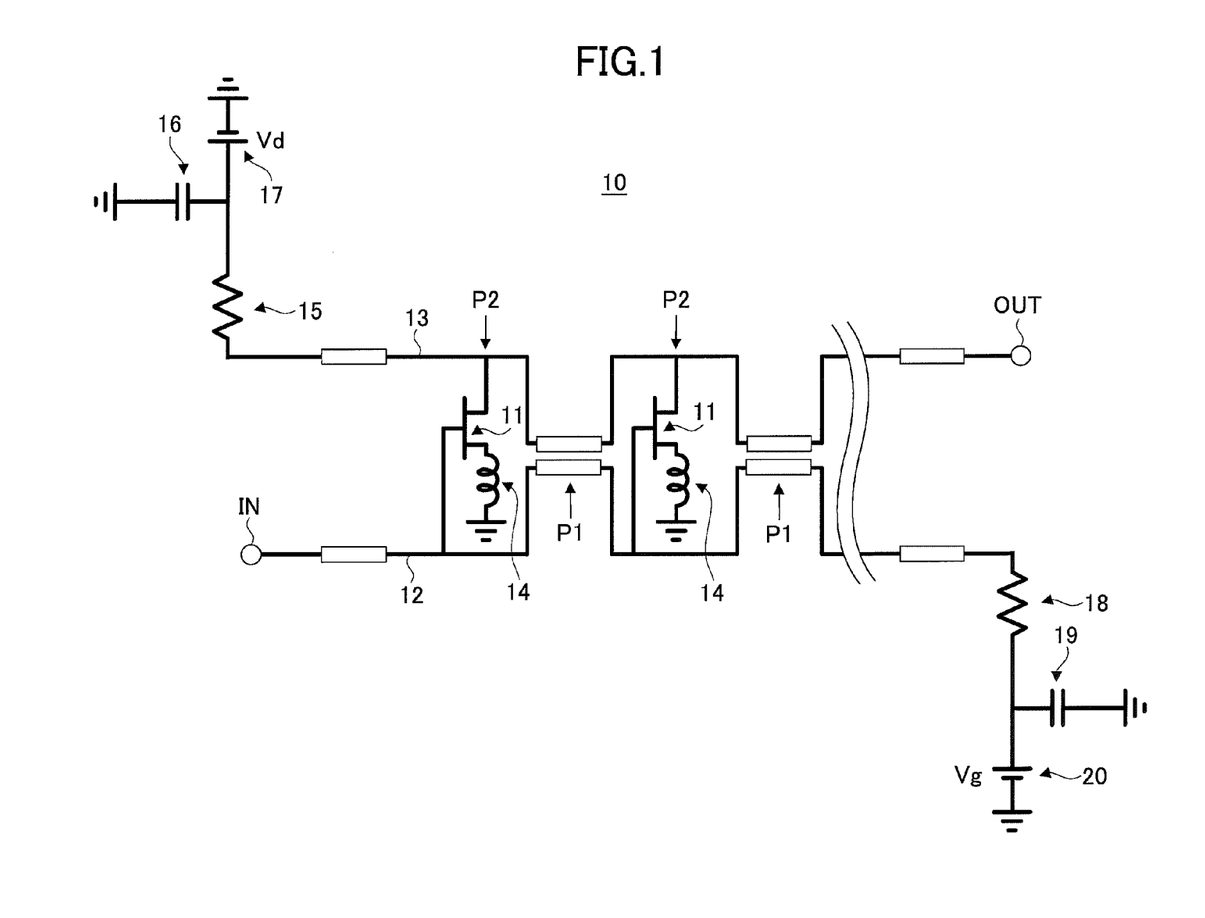
FIG. 1 is a drawing illustrating an example of the configuration of a distributed amplifier.

FIG. 1 is a drawing illustrating an example of the configuration of a distributed amplifier. A distributed amplifier 10 illustrated in FIG. 1 includes a plurality of transistors 11, an input line 12, an output line 13, inductors 14, a resistor element 15, a capacitor 16, a voltage source 17, a resistor element 18, a capacitor 19, and a voltage source 20. The input line 12 connects the gate electrodes of the transistors 11 to each other. The output line 13 connects the drain electrodes of the transistors 11 to each other. The source electrodes of the transistors 11 are coupled to the ground through the respective inductors 14. In this manner, the transistors 11 are connected in parallel to each other by the input line 12, the output line 13, and the ground. It may be noted that although FIG. 1 explicitly illustrate only two transistors 11, any number of transistors 11 may be provided.

The input line 12 is coupled to the ground through the resistor element 18 and the capacitor 19. The voltage source 20 generates a gate voltage Vg that is applied to the input line 12. The output line 13 is coupled to the ground through the resistor element 15 and the capacitor 16. The voltage source 17 generates a power supply voltage Vd that is applied to the output line 13.

The input line 12 has one end thereof coupled to the ground and an opposite end thereof serving as an input node IN, which receives an input signal. The output line 13 has one end thereof coupled to the ground and an opposite end thereof serving as an output node OUT, which produces an output signal. In the case of the input signal being a sinusoidal wave, for example, the output signal is also a sinusoidal wave having the amplitude thereof amplified and the phase thereof displaced relative to the input signal.

At a position P1 situated between immediately adjacent transistors among the plurality of transistors 11, electromagnetic coupling is formed between the input line 12 and the output line 13. Namely, the input line 12 and the output line 13 are coupled to each other through inductive coupling and capacitive coupling. Electromagnetic coupling may be realized by placing the wire of the input line 12 and the wire of the output line 13 in close proximity to each other. The distance between the input line 12 and the output line 13 is a first length at positions P2 where the transistors 11 are situated, and is a second length shorter than the first length at the position P1 between immediately adjacent transistors among the plurality of transistors 11. In the proximity of the position P1 and in the proximity of the position P2, the input line 12 and the output line 13 may be placed to extend side by side with each other The term "position" used herein refers to a position in the direction in which the line formed by the transistors 11 extends, i.e., a position in the direction in which the transmission lines including the input line 12 and the output line 13 extend. Further, the positions P2 of the transistors 11 may refer to the positions at which the transistors 11 are connected to the input line 12 and to the output line 13. The position P1 situated between immediately adjacent transistors refers to a position that is situated between the first position at which a given transistor 11 is connected to the input line 12 and to the output line 13 and the second position at which a transistor 11 immediately adjacent to the given transistor 11 is connected to the input line 12 and to the output line 13.

The fact that electromagnetic coupling is formed between the input line 12 and the output line at the position P1 does not mean that no electromagnetic coupling is formed between the input line 12 and the output line 13 at other positions (e.g., at the positions P2). Electromagnetic coupling may be formed also at other positions (e.g., at the positions P2) between the input line 12 and the output line 13. The strength of electromagnetic coupling at other positions (e.g., at the positions P2) may be weaker than the strength of electromagnetic coupling at the position P1. Further, the strength of electromagnetic coupling at other positions (e.g., at the positions P2) may be so weak as to be ignorable.

Alternatively, the strength of electromagnetic coupling at other positions (e.g., at the positions P2) may be as strong as the strength of electromagnetic coupling at the position P1. Namely, the distance between the input line 12 and the output line 13 at other positions (e.g., at the positions P2) may be substantially the same as or similar to the distance between the input line 12 and the output line 13 at the position P1. For example, the distance between the input line 12 and the output line 13 may be kept at a constant length that ensures sufficient electromagnetic coupling. However, the placement of the input line 12 and the output line 13 directly over the gate electrode and the source and drain diffusion regions of a transistor 11 causes interference to occur between the transistor and each of the input line 12 and the output line 13. Because of this, the distance between the input line 12 and the output line 13 at the positions P2 may be set wider than the size of the transistors (e.g., the gate width thereof). In this case, the distance between the input line 12 and the output line 13 at the position P1 situated between immediately adjacent transistors may be set shorter than the gate width of the transistors 11.

Figure 2:
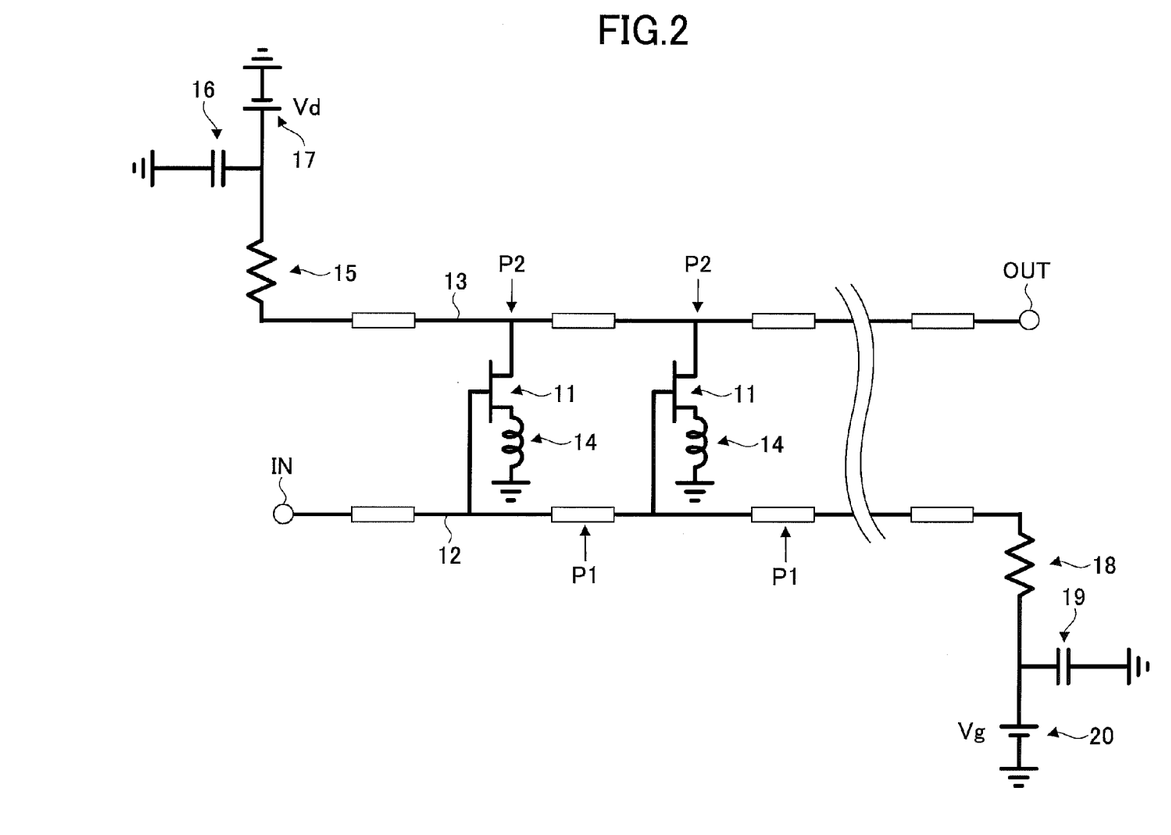
FIG. 2 is a drawing illustrating an example of the configuration of a distributed amplifier which is provided for comparison purposes and for which no electromagnetic coupling is taken into account.

FIG. 2 is a drawing illustrating an example of the configuration of a distributed amplifier which is provided for comparison purposes and for which no electromagnetic coupling is taken into account. In FIG. 2, the same or corresponding elements as those of FIG. 1 are referred to by the same or corresponding numerals, and a description thereof will be omitted as appropriate.

In the configuration illustrated in FIG. 2, the distance between the input line 12 and the output line 13 at the positions P2 of the transistors 11 are the same as, or shorter than, the distance between the input line 12 and the output line 13 at the position P1 situated between immediately adjacent transistors among the plurality of transistors 11. This distance is sufficiently wide such that the electromagnetic coupling between the input line 12 and the output line 13 is ignorable.

Figure 3:
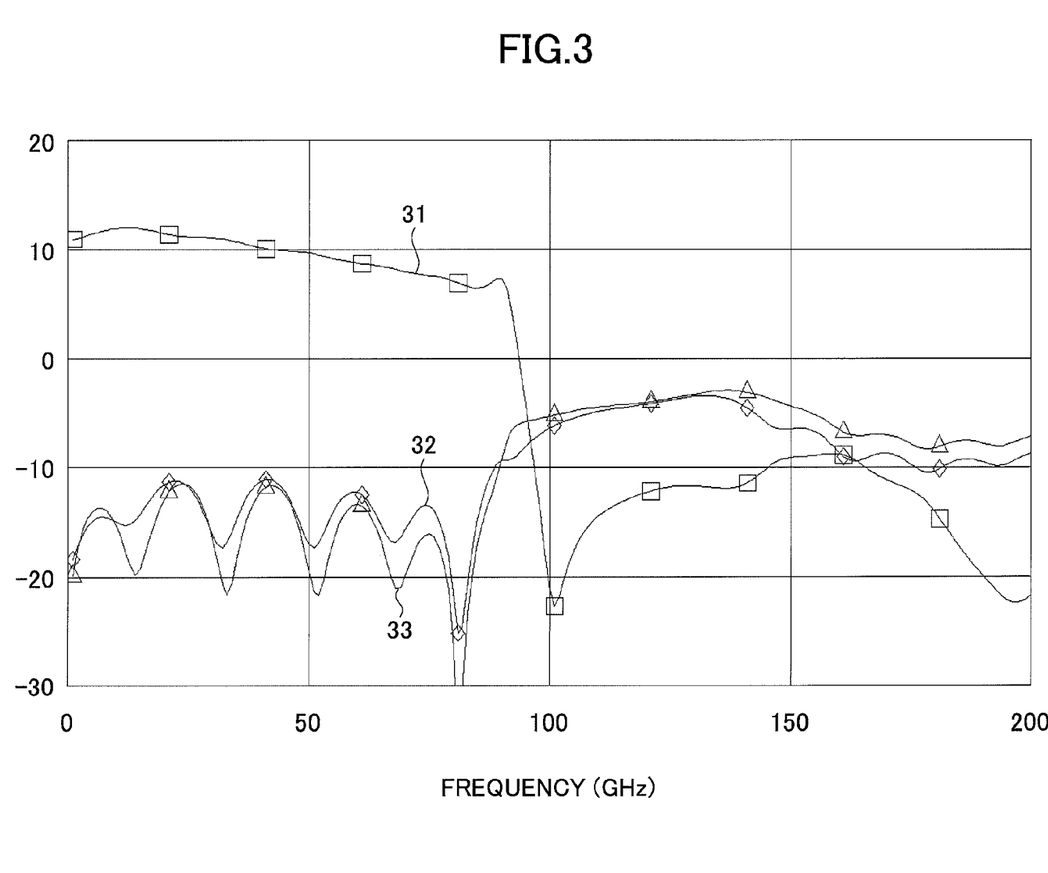
FIG. 3 is a drawing illustrating an example of characteristics of the distributed amplifier illustrated in FIG. 2 obtained by a computer simulation.

FIG. 3 is a drawing illustrating an example of characteristics of the distributed amplifier illustrated in FIG. 2 obtained by a computer simulation. In this computer simulation, six transistors 11 that are InP HEMTs (i.e., high electron mobility transistors) are arranged in a line, with the gate electrodes of immediately adjacent transistors being connected to each other through a wire that is 760 micrometers in length, 6 micrometers in width, and 2 micrometers in thickness. The drain electrodes of immediately adjacent transistors are connected to each other through a wire that is 760 micrometers in length, 6 micrometers in width, and 2 micrometers in thickness. The gate width of the transistors 11 is 20 micrometers. The wires are placed on a BCB (i.e., benzocyclobutene) substrate having a relative permittivity of 2.8 and a thickness of 6.35 micrometers. S parameters under these conditions are illustrated in FIG. 3.

In FIG. 3, the horizontal axis represents frequency, and the vertical axis represents the S-parameter gain. A characteristic curve 31 represents $S_{21}$, and a characteristic curve 32 represents $S_{22}$, with a characteristic curve 33 representing $S_{11}$. As illustrated in FIG. 3, the characteristic curve 31 indicative of transmission characteristics exhibits a drop at 90 GHz, providing a bandwidth of 90 GHz.

Figure 4:
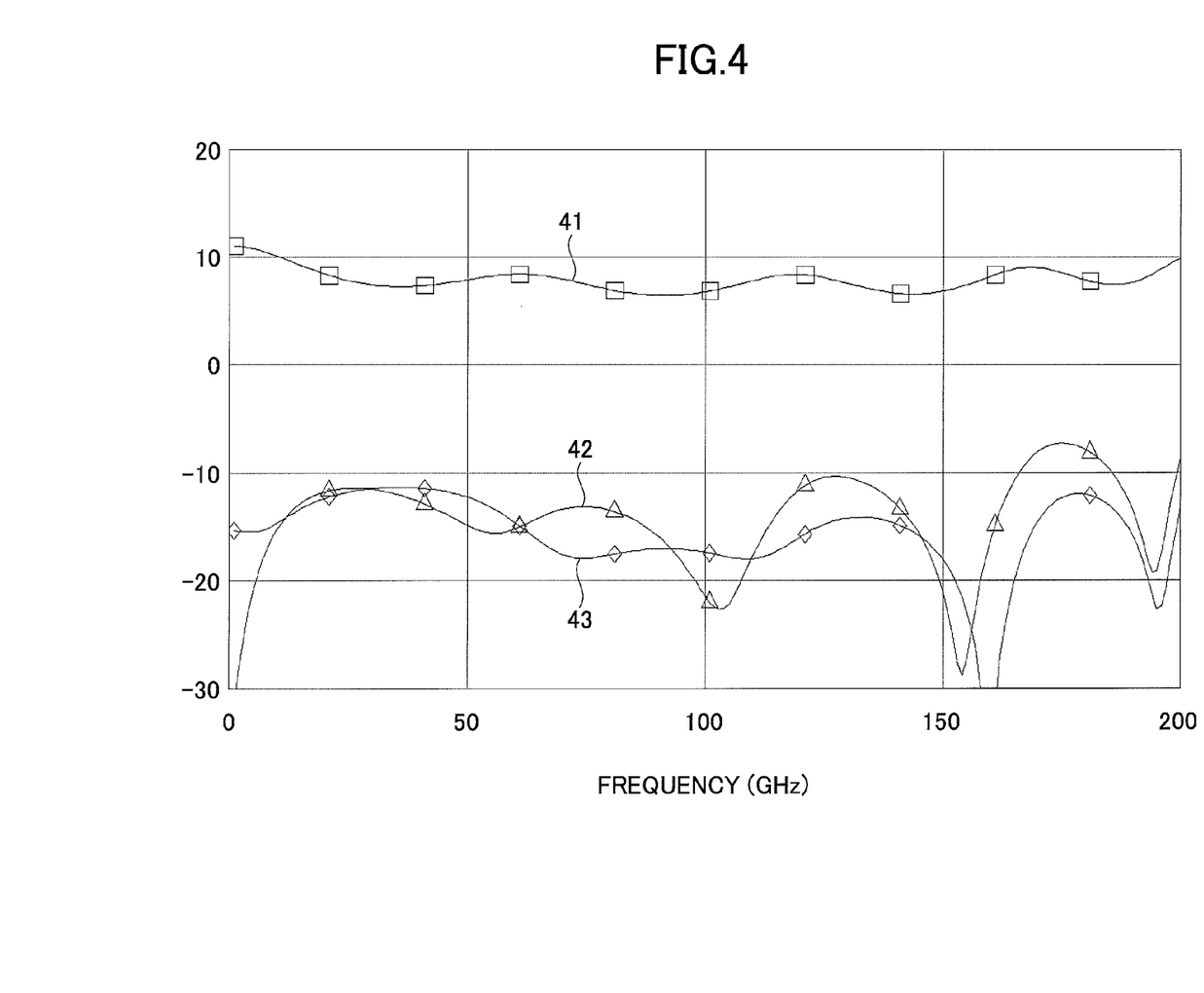
FIG. 4 is a drawing illustrating an example of characteristics of the distributed amplifier illustrated in FIG. 1 obtained by a computer simulation.

FIG. 4 is a drawing illustrating an example of characteristics of the distributed amplifier illustrated in FIG. 1 obtained by a computer simulation. In this computer simulation, six transistors 11 that are InP HEMTs (i.e., high electron mobility transistors) are arranged in a line, with the gate electrodes of immediately adjacent transistors being connected to each other through a wire that is 200 micrometers in length, 6 micrometers in width, and 2 micrometers in thickness. The drain electrodes of immediately adjacent transistors are connected to each other through a wire that is 200 micrometers in length, 6 micrometers in width, and 2 micrometers in thickness. The gate width of the transistors 11 is 20 micrometers. The wires are placed on a BCB substrate having a relative permittivity of 2.8 and a thickness of 6.35 micrometers. A portion of the wires at which electromagnetic coupling is formed has a length of 200 micrometers, and the distance between the wires at this portion is 6 micrometers. S parameters under these conditions are illustrated in FIG. 4.

In FIG. 4, the horizontal axis represents frequency, and the vertical axis represents the S-parameter gain. A characteristic curve 41 represents $S_{22}$, and a characteristic curve 42 represents $S_{22}$, with a characteristic curve 43 representing $S_{11}$. As illustrated in FIG. 4, the characteristic curve 41 indicative of transmission characteristics maintains a high gain at 200 GHz, providing a bandwidth wider than 200 GHz.

Figure 5:
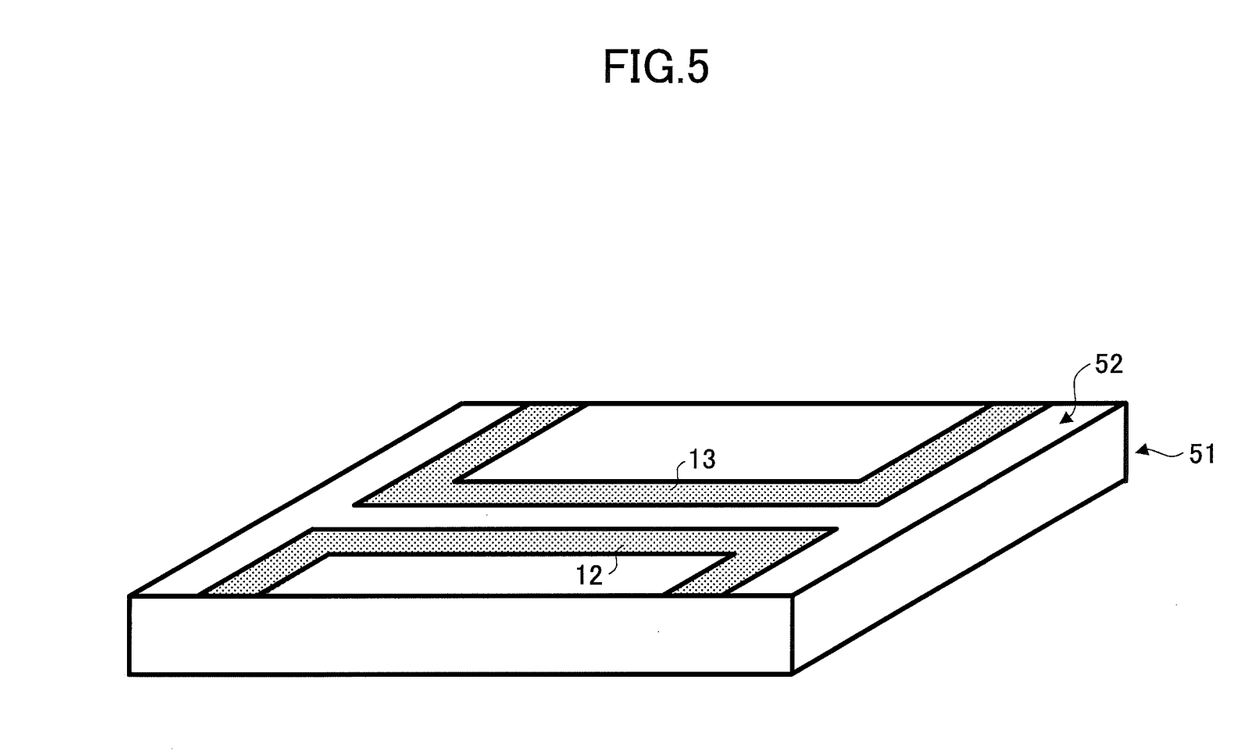
FIG. 5 is a drawing illustrating an example of the structure of arrangement of an input line and an output line.

FIG. 5 is a drawing illustrating an example of the structure of arrangement of the input line 12 and the output line 13. In FIG. 5, the same or corresponding elements as those of FIG. 1 are referred to by the same or corresponding numerals, and a description thereof will be omitted as appropriate. The structure of wire arrangement illustrated in FIG. 5 has an interconnect layer 52 that is formed on the upper surface of a substrate 51. The input line 12 and the output line 13 are placed in the same interconnect layer 52. In the computer simulations illustrated in FIG. 3 and FIG. 4, the input line 12 and the output line 13 are placed in the same interconnect layer 52 as illustrated in FIG. 5.

Figure 6:
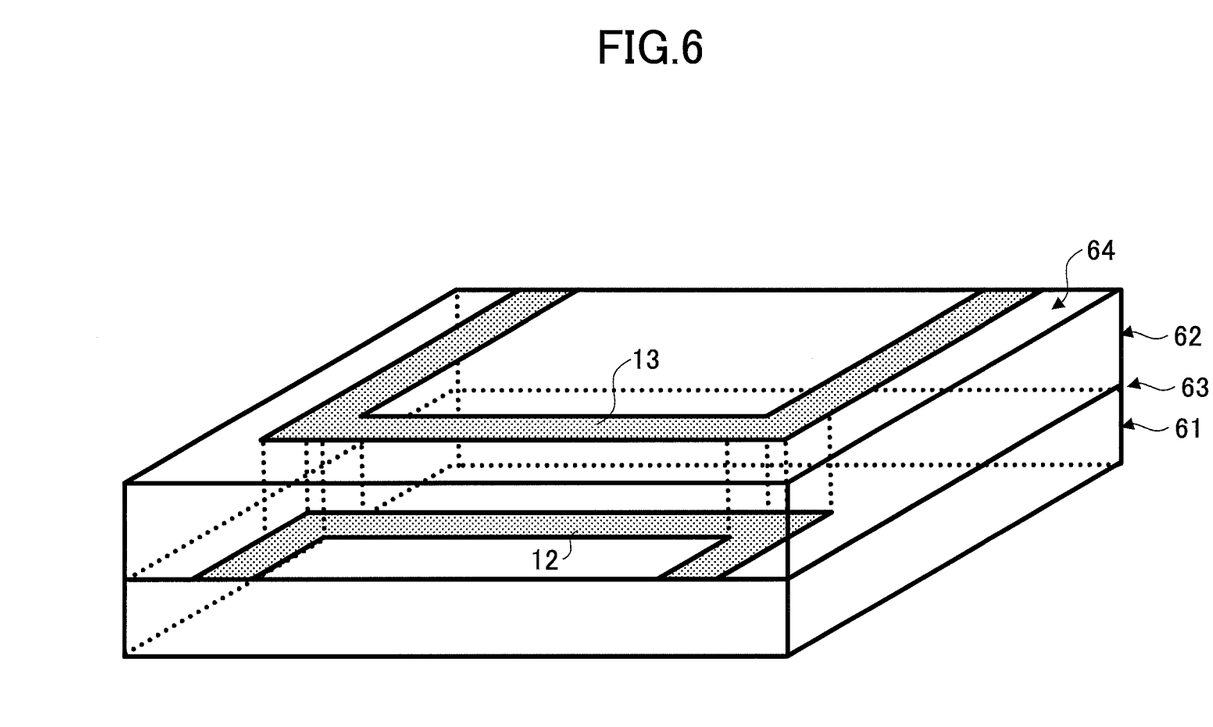
FIG. 6 is a drawing illustrating another example of the structure of arrangement of an input line and an output line.

FIG. 6 is a drawing illustrating another example of the structure of arrangement of the input line 12 and the output line 13. In FIG. 6, the same or corresponding elements as those of FIG. 1 are referred to by the same or corresponding numerals, and a description thereof will be omitted as appropriate. The structure of wire arrangement illustrated in FIG. 6 includes an interconnect layer 63, an insulating film 62, and an interconnect layer 64 that are stacked one over another on a substrate 61. The input line 12 and the output line 13 are placed in the interconnect layer 63 and the interconnect layer 64, respectively, between which the insulating film 62 is situated. The input line 12 may be placed in any one of the interconnect layers 63 and 64, and the output line 13 may be placed in the other one of the interconnect layers 63 and 64.

Figure 7A:
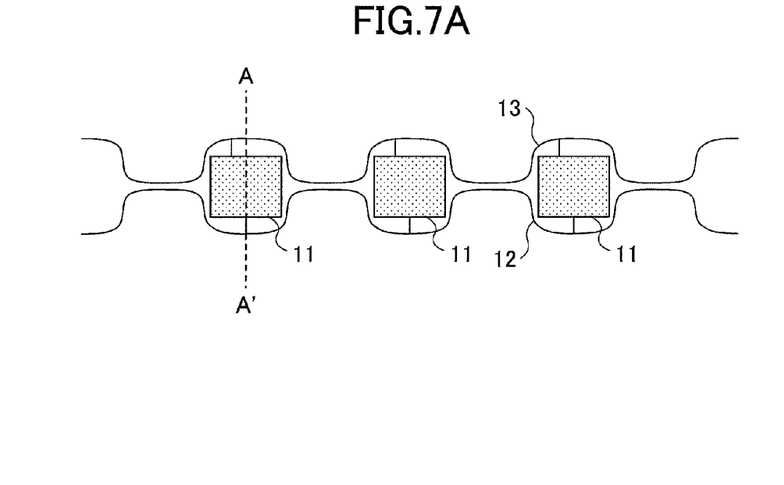
FIGS. 7A and 7B are drawings illustrating an example of the structure used to implement transistors, the input line and the output line.
Figure 7B:
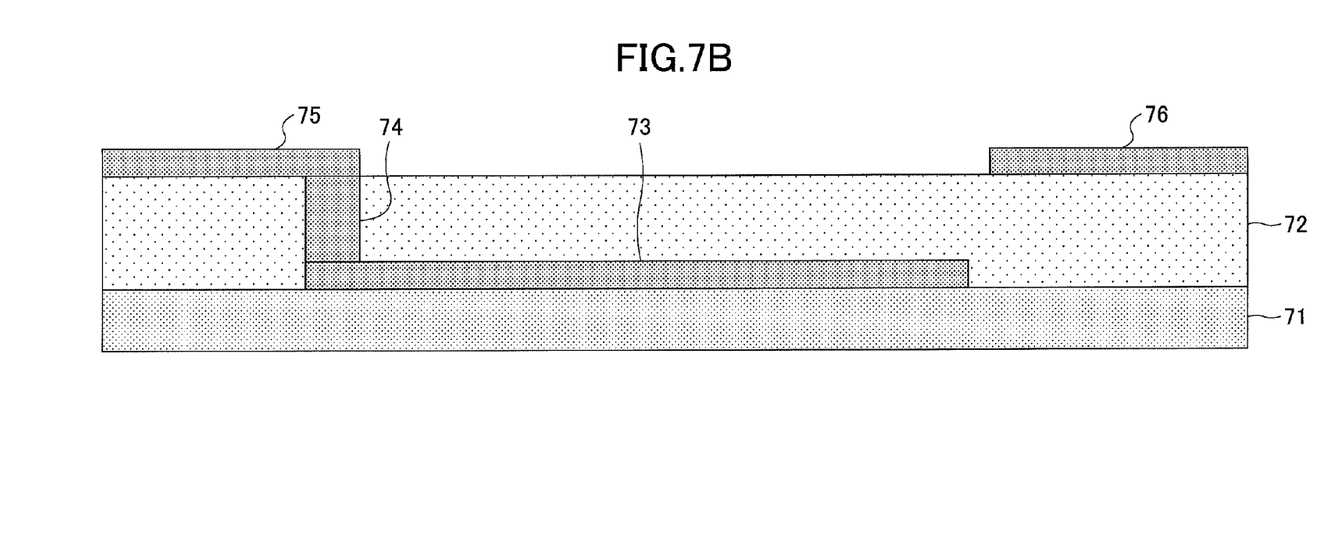

FIGS. 7A and 7B are drawings illustrating an example of the structure used to implement the transistors 11, the input line 12 and the output line 13. In FIG. 7, the same or corresponding elements as those of FIG. 1 are referred to by the same or corresponding numerals, and a description thereof will be omitted as appropriate.

FIG. 7A illustrates an example of electrical connections and physical arrangement of the transistors 11, the input line 12 and the output line 13. FIG. 7B illustrates a cross-sectional view of the implemented structure as taken along a line A-A' illustrated in FIG. 7A. As illustrated in FIG. 7B, a protective film 72 and a gate electrode 73 of a transistor 11 are formed on a substrate 71. A wire 75 corresponding to the input line 12 and a wire 76 corresponding to the output line 13 are formed on the protective film 72. The wire 75 corresponding to the input line 12 is electrically coupled to the gate electrode 73 through an extension wire 74.

In FIG. 7B, two diffusion regions corresponding to the source and drain of the transistor 11 are formed in the substrate 71 in areas situated off the position that is directly below the gate electrode 73 to either side in the direction perpendicular to the drawing sheet. The wire 76 corresponding to the output line 13 is electrically coupled to the drain diffusion region through an extension wire. These diffusion regions and extension wire do not appear in FIG. 7B because they are situated off the plane of the drawing sheet As was previously described, the distance between the input line 12 and the output line 13 at the positions P2 illustrated in FIG. 1 may be set wider than the gate width of the transistors 11. Namely, as illustrated in FIGS. 7A and 7B, the gap between the input line 12 and the output line 13 in the cross-section taken along the line A-A' in FIG. 7A may be set wider than the gate width of the transistors 11. Further, as illustrated in FIG. 7A, the distance between the input line 12 and the output line 13 at a position situated between immediately adjacent transistors 11 may be set shorter than the size (i.e., gate width) of the transistors 11.

Figure 8:
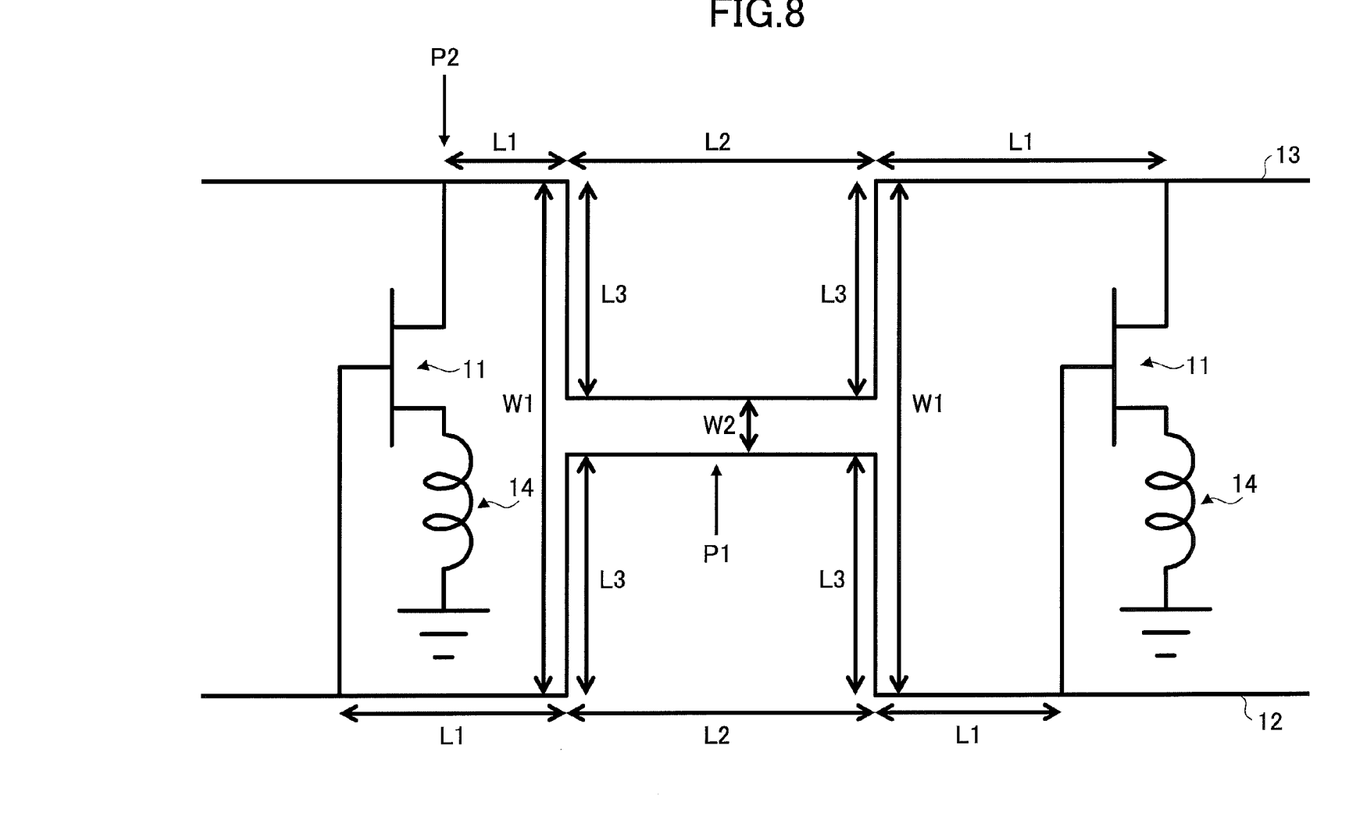
FIG. 8 is a drawing illustrating the conditions of the computer simulation conducted to check the effect of electromagnetic coupling.

FIG. 8 is a drawing illustrating the conditions of the computer simulation conducted to check the effect of electromagnetic coupling. In FIG. 8, the same or corresponding elements as those of FIG. 1 are referred to by the same or corresponding numerals, and a description thereof will be omitted as appropriate.

As illustrated in FIG. 8, the distance between the input line 12 and the output line 13 is equal to a length W1 at the positions P2 of the transistors 11, and is equal to a length W2 shorter than the length W1 at the position P1 situated between immediately adjacent transistors 11. The portions of the input line 12 and the output line 13 that are placed at an interval of the length W2 each have a length L2. Namely, the length of the portion of the input line 12 and the length of the portion of the output line 13 that are electromagnetically coupled to each other are L2. The portions of the input line 12 and the output line 13 that are spaced apart from each other by a distance of the length W2 are connected through lines each having a length L3 to the portions of the input line 12 and the output line 13 that are spaced apart from each other by a distance of the length W1. The length of the input line 12 (or the output line 13) between the position at which a transistor 11 is connected to the input line 12 (or to the output line 13) and one end of the line having the length L3 is L1. For the sake of convenience of illustration, the portion of the input line 12 having the length L1 and the portion of the output line 13 having the length L1 appear in FIG. 8 as if their lengths are different. In the computer simulation, however, the portion of the input line 12 having the length L1 and the portion of the output line 13 having the length L1 have the same length.

In the computer simulation described below, the same conditions that were described in connection with FIG. 3 are used. Namely, six transistors 11 that are InP HEMTs (i.e., high electron mobility transistors) are arranged in a line, with the gate electrodes of immediately adjacent transistors being connected to each other through a wire that is 6 micrometers in width and 2 micrometers in thickness. The drain electrodes of immediately adjacent transistors are connected to each other through a wire that is 6 micrometers in width and 2 micrometers in thickness. The gate width of the transistors 11 is 20 micrometers. The wires are placed on a BCB (i.e., benzocyclobutene) substrate having a relative permittivity of 2.8 and a thickness of 6.35 micrometers.

Figure 9:
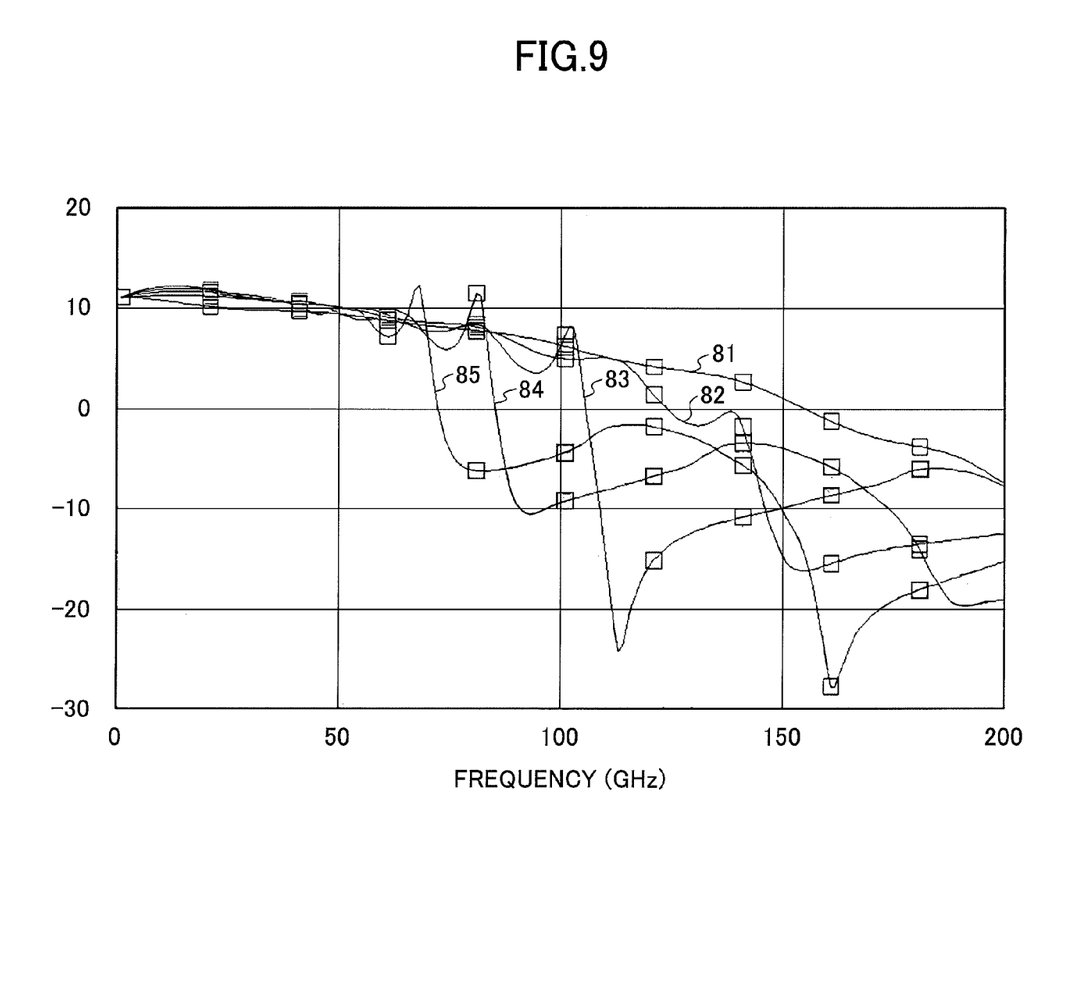
FIG. 9 is a drawing illustrating the results of a computer simulation regarding the characteristics of a distributed amplifier conducted under the condition that no electromagnetic coupling exists between the input line and the output line.

FIG. 9 is a drawing illustrating the results of computer simulation regarding the characteristics of a distributed amplifier conducted under the condition that no electromagnetic coupling exists between the input line 12 and the output line 13. Namely, FIG. 9 illustrates, like FIG. 2, the results of computer simulation conducted under the condition that the input line 12 and the output line 13 are placed at a sufficiently long interval so as to make the effect of electromagnetic coupling negligible.

In FIG. 9, the horizontal axis represents frequency, and the vertical axis represents the S-parameter gain. Characteristic curves 81, 82, 83, 84 and 85 represent a transmission characteristic $S_{21}$ in the case of the length of the line connecting between immediately adjacent transistors being 200, 400, 600, 800 and 1000 micrometers, respectively. As illustrated in FIG. 9, the transmission characteristics have the bandwidth thereof limited at higher frequencies.

FIGS. 10 through 13 are drawings illustrating the results of computer simulation regarding the characteristics of a distributed amplifier conducted under the condition that electromagnetic coupling exists between the input line 12 and the output line 13. FIGS. 10 through 13 illustrate, like FIG. 8, the results of computer simulation regarding the characteristics of a distributed amplifier in which the input line 12 and the output line 13 have an electromagnetically coupled section having the wire length L2 at a portion between transistors (i.e., at the position P1) as illustrated in FIG. 8. The length W2 of an interval of the electromagnetically coupled lines is 6 micrometers. The computer simulation is conducted under the condition that electromagnetic coupling is nonexistent with respect to the portion having the wire length L1 and the portion having the wire length L3, which are the wire portions other than the portion having the wire length L2.

Figure 10:
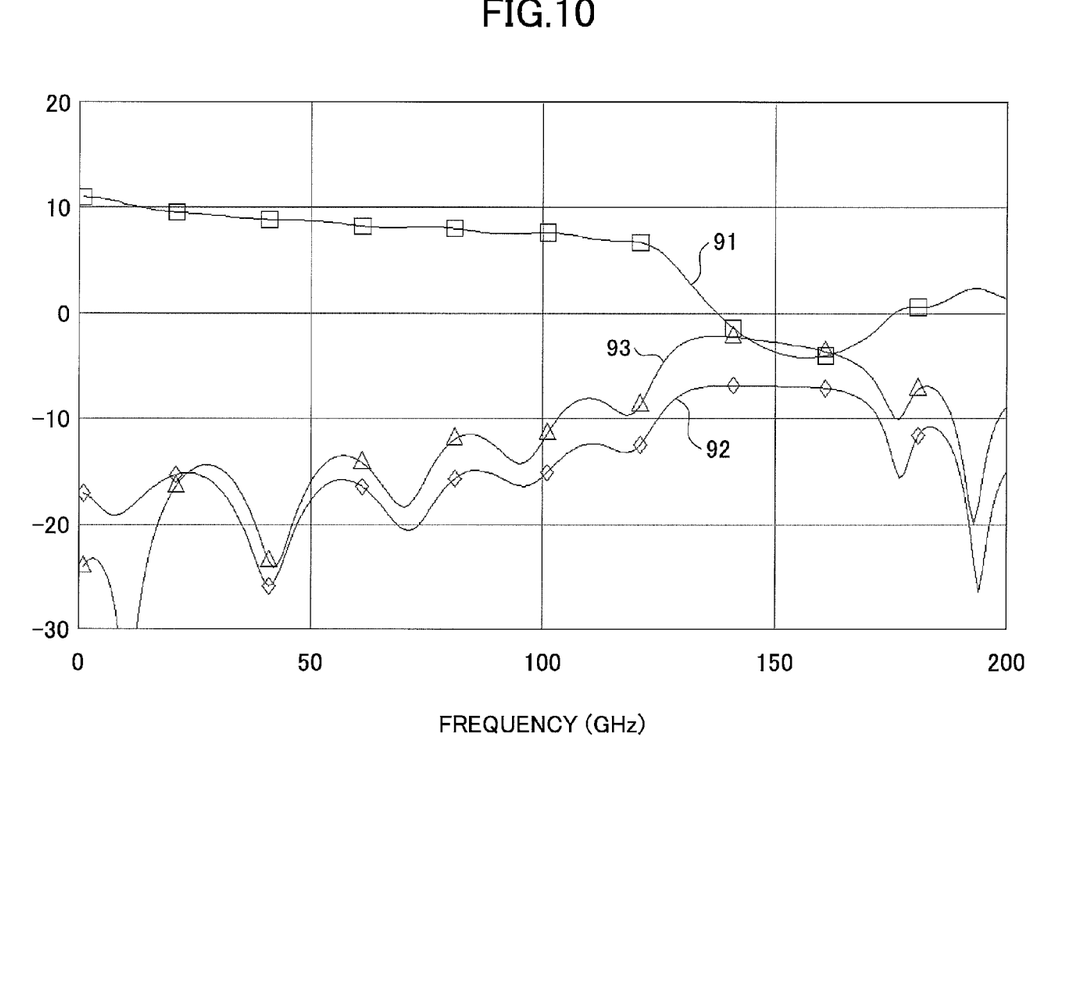
FIG. 10 is a drawing illustrating the results of a computer simulation regarding the characteristics of a distributed amplifier conducted under the condition that electromagnetic coupling exists between the input line and the output line.

In FIG. 10, the horizontal axis represents frequency, and the vertical axis represents the S-parameter gain. FIG. 10 illustrates characteristics obtained under the conditions that L1+L3 is equal to 100 micrometers, and L2 is equal to 400 micrometers, with W2 being equal to 6 micrometers. Characteristic curves 91, 92 and 93 represent $S_{21}$, $S_{22}$ and $S_{11}$, respectively. As illustrated in FIG. 10, the characteristic curve 91 indicative of transmission characteristics maintains a high gain up to around 130 GHz, providing a bandwidth of approximately 130 GHz. Further, the characteristic curves 92 and 93 indicative of reflection characteristics are lower than 0 decibel, thereby enabling the provision of a stable amplifier operation.

Figure 11:
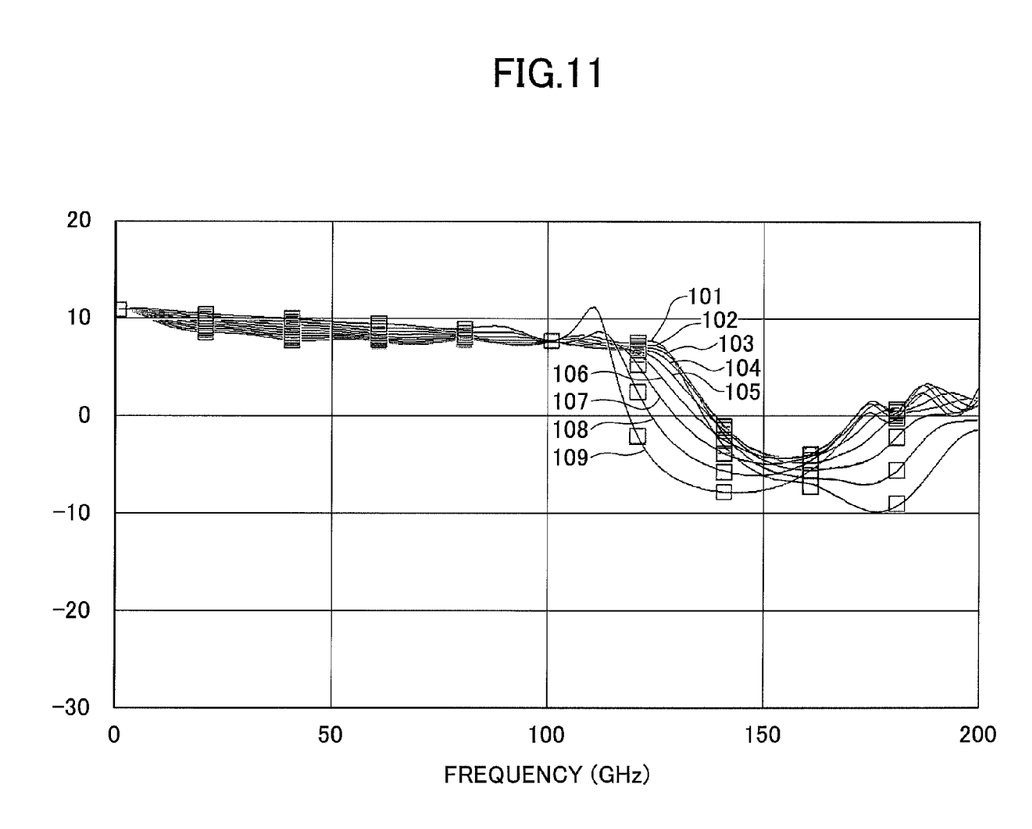
FIG. 11 is a drawing illustrating the results of a computer simulation regarding the characteristics of a distributed amplifier conducted under the condition that electromagnetic coupling exists between the input line and the output line.

In FIG. 11, the horizontal axis represents frequency, and the vertical axis represents the S-parameter gain. FIG. 11 illustrates characteristics observed under the condition that (L1+L3)×2+L2 is fixedly set equal to 600 micrometers. Under the condition that (L1+L3)×2+L2 is fixedly set equal to 600 micrometers, Characteristic curves 101, 102, 103, 104, 105, 106, 107, 108 and 109 represent transmission characteristics $S_{21}$ in the case of L1+L3 being equal to 0, 25, 50, 75, 100, 125, 150, 175 and 200 micrometers, respectively. The longer the length L1+L3 is, i.e., the shorter the length L2 is, the narrower the bandwidth is. Accordingly, with the wire length being constant, the length of the section of the lines that are electromagnetically coupled to each other is preferably set to as long a length as possible.

Figure 12:
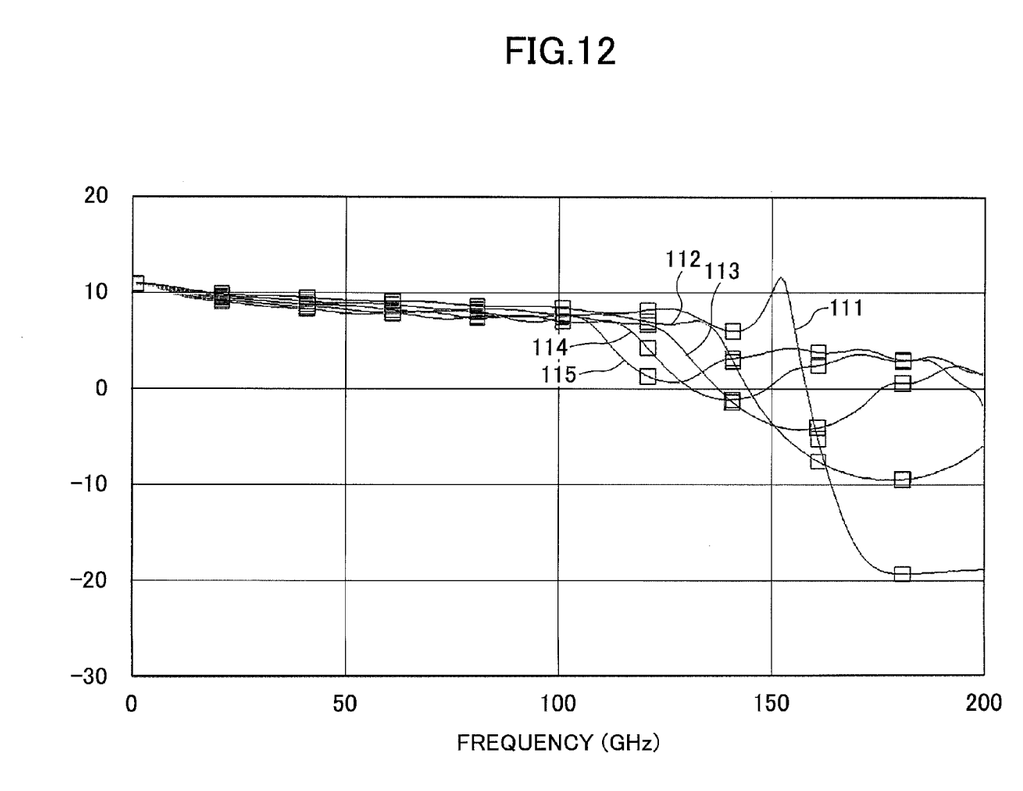
FIG. 12 is a drawing illustrating the results of a computer simulation regarding the characteristics of a distributed amplifier conducted under the condition that electromagnetic coupling exists between the input line and the output line.

In FIG. 12, the horizontal axis represents frequency, and the vertical axis represents the S-parameter gain. FIG. 12 illustrates characteristics observed under the condition that L1+L3 is fixedly set equal to 100 micrometers. L2 is changed under the condition that L1+L3 is fixedly set equal to 100 micrometers. Characteristic curves 111, 112, 113, 114 and 115 represent transmission characteristics $S_{21}$ in the case of L2 being 200, 300, 400, 500 and 600 micrometers, respectively. The longer the length L2 is, the narrower the bandwidth is. It follows that the length of the section of the lines that are electromagnetically coupled to each other is preferably set equal to as short a length as possible in the case of L1+L3 being constant.

Figure 13:
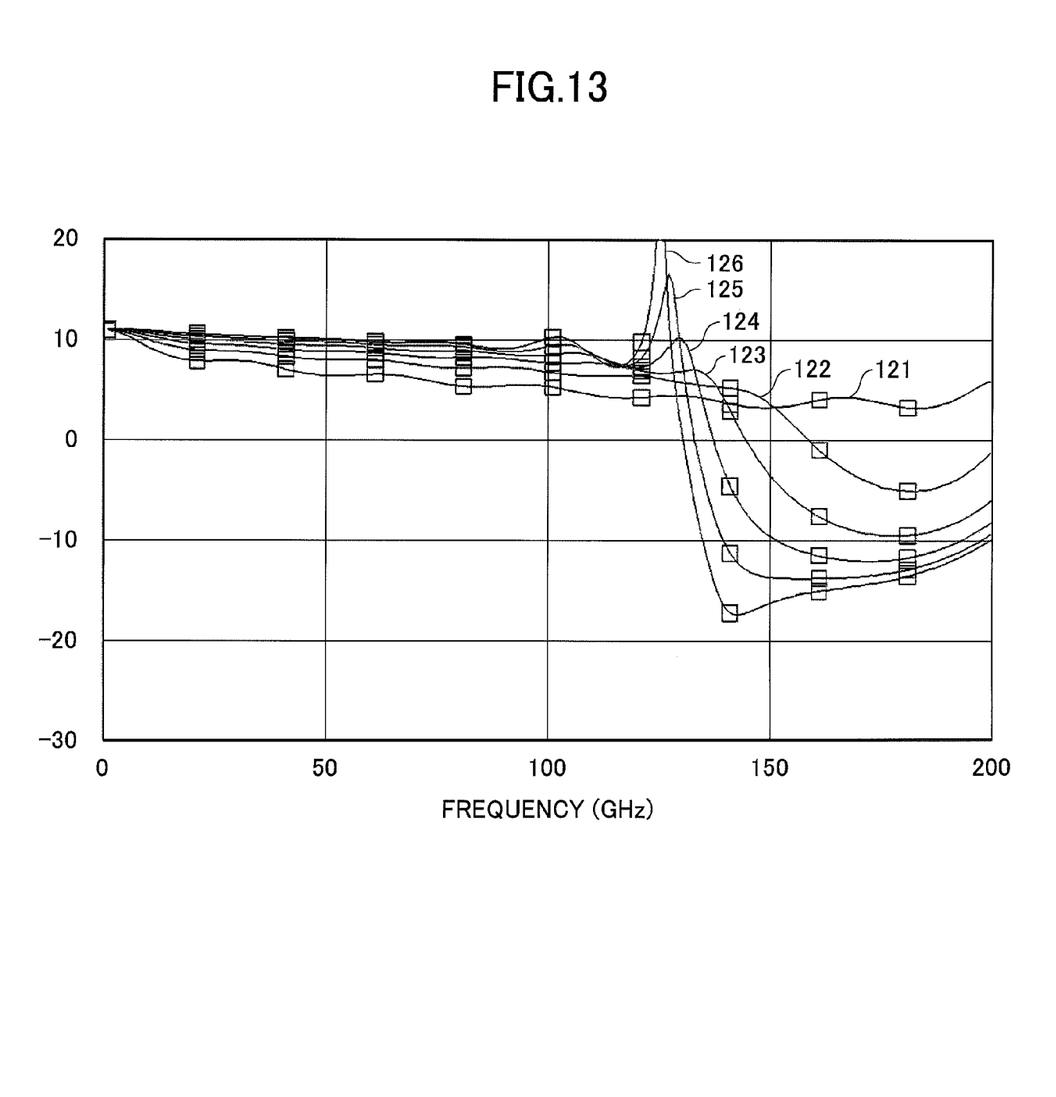
FIG. 13 is a drawing illustrating the results of a computer simulation regarding the characteristics of a distributed amplifier conducted under the condition that electromagnetic coupling exists between the input line and the output line.

In FIG. 13, the horizontal axis represents frequency, and the vertical axis represents the S-parameter gain. FIG. 13 illustrates characteristics observed under the conditions that L1+L3 is fixedly set equal to 100 micrometers and that L2 is fixedly set equal to 300 micrometers. The length W2 of an interval between the lines at the position of electromagnetic coupling is changed under the conditions that each of L1+L3 and L2 is fixed. Characteristic curves 121, 122, 123, 124, 125 and 126 represent transmission characteristics $S_{21}$ in the case of W2 being equal to 12, 10, 8, 6, 4 and 2 micrometers, respectively. The longer the gap length W2 is, the narrower the bandwidth is. In the case of the gap length W2 being a large value such as 12 micrometers, the gain of the transmission characteristic $S_{21}$ has a lower profile across the most part of the entire range than in the case of the gap length W2 being narrower, which results in an increase in the reflection characteristics by an amount proportionate to the lowered transmission characteristic. In the case of W2 being 2 micrometers, the reflection characteristic exceeds 0 decibel at some frequency points, rendering the operation of the distributed amplifier unstable. In consideration of the above, according to the results of computer simulation illustrated in FIG. 13, an appropriate value of the gap length W2 is in the range of 6 micrometers to 8 micrometers.

As can be understood from the descriptions provided above, electromagnetically coupling the input line and the output line through an appropriate gap length W2 between the lines is preferable in terms of securing a wide bandwidth and stable operations. As was previously described, however, the interval between the input line and the output line at the positions of the transistors (i.e., at the positions P2 in FIG. 1) may preferably set wider than the size (e.g., the gate width) of the transistors when considering limitations imposed at the time of implementation. As illustrated in FIG. 1, thus, the distance between the input line 12 and the output line 13 may be set to the first length at the positions P2, and may be set to the second length shorter than the first length at the position P1.

According to at least one embodiment, a distributed amplifier is provided that has broad bandwidth characteristics.

Further, the present invention is not limited to these embodiments, but various variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A distributed amplifier, comprising:
a plurality of transistors;
a first line connecting gate electrodes of the transistors to each other; and
a second line connecting drain electrodes of the transistors to each other,
wherein the first line and the second line are electromagnetically coupled to each other at a position situated between immediately adjacent transistors among the plurality of transistors,
wherein a distance between the first line and the second line is a first length at positions at which the first line and the second line are connected to the transistors, and is a second length shorter than the first length at the position situated between the immediately adjacent transistors among the plurality of transistors, the distance between the first line and the second line being defined as a distance between a straight line segment of the first line and a straight line segment of the second line.

2. The distributed amplifier as claimed in claim 1, wherein the first line and the second line are placed in a same interconnect layer.

3. The distributed amplifier as claimed in claim 1, wherein the first line and the second line are placed in two respective interconnect layers that have an insulating layer placed therebetween.

4. The distributed amplifier as claimed in claim 1, wherein the distance between the first line and the second line at the position situated between the immediately adjacent transistors is shorter than a gate width of the transistors.

* * * * *